United States Patent
Buckingham et al.

(10) Patent No.: US 10,393,172 B2
(45) Date of Patent: Aug. 27, 2019

(54) TOUCHPAD GUIDED BY A LINEAR BEARING

(71) Applicant: VISTEON GLOBAL TECHNOLOGIES, INC., Van Buren Township, MI (US)

(72) Inventors: Thomas Buckingham, Van Buren Township, MI (US); Douglas Allen Pfau, Van Buren Township, MI (US)

(73) Assignee: Visteon Global Technologies, INC., Van Buren Township, MI (US)

( * ) Notice: Subject to any disclaimer, the term of this patent is extended or adjusted under 35 U.S.C. 154(b) by 0 days.

(21) Appl. No.: 15/665,801

(22) Filed: Aug. 1, 2017

(65) Prior Publication Data
US 2019/0040906 A1    Feb. 7, 2019

(51) Int. Cl.
*F16C 29/06*    (2006.01)
*H01H 13/12*    (2006.01)
(Continued)

(52) U.S. Cl.
CPC ........ *F16C 29/0607* (2013.01); *F16C 29/045* (2013.01); *F16C 29/046* (2013.01);
(Continued)

(58) Field of Classification Search
CPC .............. F16C 29/0607; F16C 29/0623; F16C 29/046; H01H 13/04; H01H 13/12
(Continued)

(56) References Cited

U.S. PATENT DOCUMENTS

| 6,388,660 B1 | 5/2002 | Manser et al. |
| 2013/0306447 A1* | 11/2013 | Polak .................... H01H 25/06 200/4 |

(Continued)

FOREIGN PATENT DOCUMENTS

| CN | 103677283 A | 3/2014 |
| JP | 2011204550 A | 10/2011 |

(Continued)

OTHER PUBLICATIONS

Database WPI Week 201433, Thomson Scientific, London, GB.
Database WPI Week 201257, Thomson Scientific, London, GB.

*Primary Examiner* — Edwin A. Leon
*Assistant Examiner* — Lheiren Mae A Caroc
(74) *Attorney, Agent, or Firm* — Quinn IP Law

(57) ABSTRACT

A button assembly includes a touchpad having an upper surface extending in a generally flat plane and movable between a first position and a second position displaced from the first position in response to the application of a pressing force perpendicular to the upper surface. Additional, smaller pushbuttons may be located adjacent the touchpad. A sub-bezel includes a housing defining a cavity for holding a linear bearing for guiding the touchpad in a linear path perpendicular to the upper surface. The linear bearing includes a plurality of first ball bearings and second ball bearings separated by a first distance perpendicular to the upper surface. The ball bearings may be sandwiched between a bearing outer member and a bearing inner member which includes an inner-top member secured to an inner-bottom member with a screw. A bearing carrier holds the ball bearings within troughs in the bearing outer member.

20 Claims, 13 Drawing Sheets

(51) Int. Cl.
  *F16C 29/04*      (2006.01)
  *H01H 13/04*      (2006.01)
  *F16C 31/00*      (2006.01)
  *H03K 17/965*     (2006.01)
  *G06F 3/0354*     (2013.01)
  *H01H 3/12*       (2006.01)
  *H01H 13/14*      (2006.01)

(52) U.S. Cl.
  CPC .......... *F16C 29/0623* (2013.01); *F16C 31/00* (2013.01); *G06F 3/03547* (2013.01); *H01H 13/04* (2013.01); *H01H 13/12* (2013.01); *H03K 17/965* (2013.01); *F16C 2226/72* (2013.01); *F16C 2226/74* (2013.01); *G06F 2203/04105* (2013.01); *H01H 3/122* (2013.01); *H01H 13/14* (2013.01)

(58) Field of Classification Search
  USPC .............................. 200/341, 520, 291, 539
  See application file for complete search history.

(56) References Cited

U.S. PATENT DOCUMENTS

| | | |
|---|---|---|
| 2015/0241903 A1 | 8/2015 | Sonmez |
| 2016/0133403 A1* | 5/2016 | Muller .................. H01H 13/20 |
| | | 200/345 |

FOREIGN PATENT DOCUMENTS

| | | |
|---|---|---|
| TW | M402491 U | 4/2011 |
| WO | 2010030969 A1 | 3/2010 |

* cited by examiner

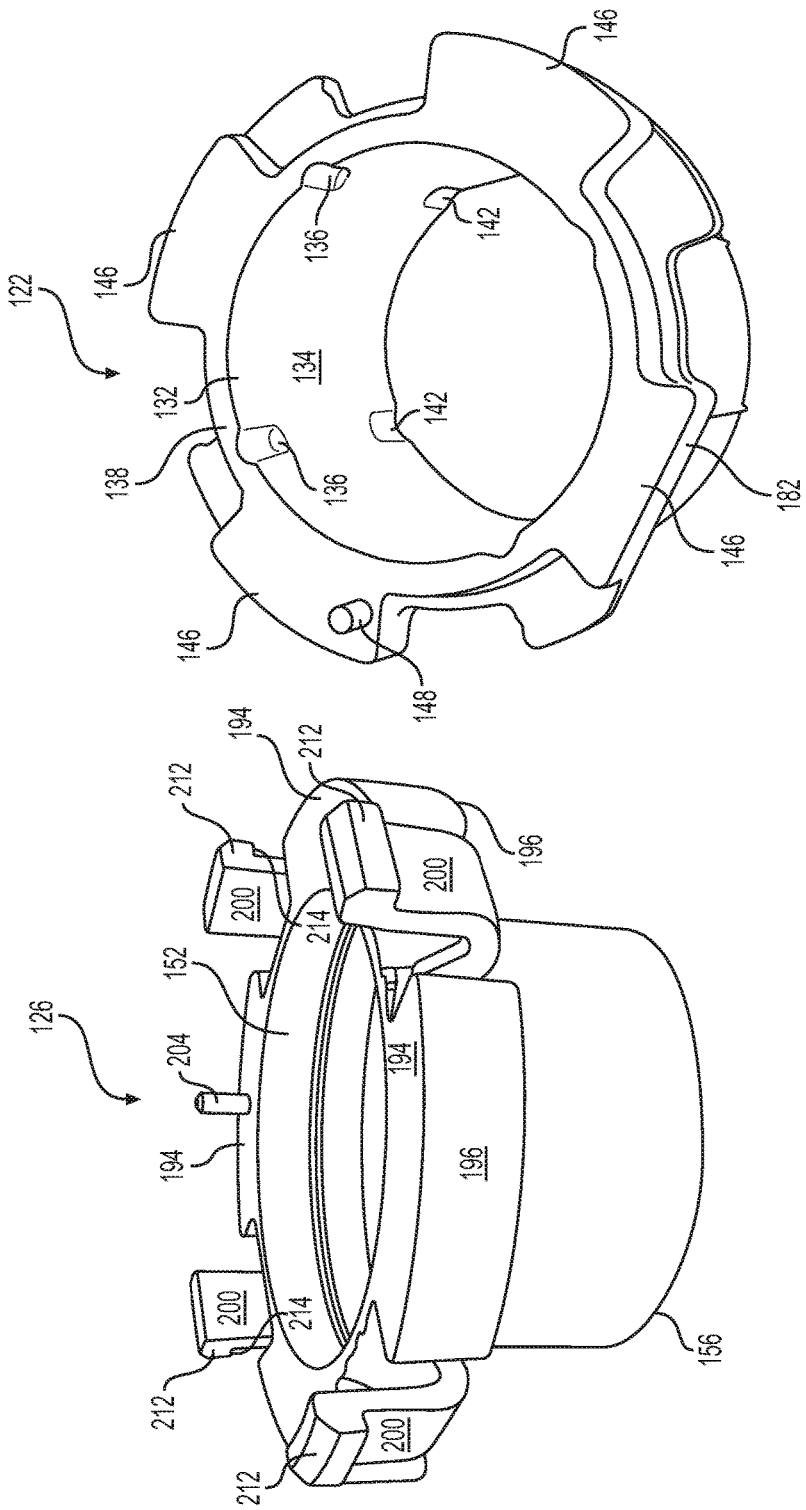

TOUCHPAD GUIDED BY A LINEAR BEARING

BACKGROUND

There exist today many different types of input devices for performing operations in an electronic device. Buttons that can be displaced linearly downwardly by being pressed are a common type of input device that is intuitive for users to operate. Touchpads buttons having a large surface much larger than a typical radio or keyboard sized button have traditionally had shortcomings that have prevented them from being linearly displaced without exhibiting wobble or tilting outside of a linear path, particularly when subjected to an off-center pressing force. Larger touchpad pushbuttons are typically controlled and guided by ribs moving in slots, which can still bind and which require gaps that can cause wobble, tilt, rattling, each of which may prevent the assembly from having a quality feel. Other factors including molding tolerances, process variation, and friction may each contribute to conventional touchpad pushbuttons having inadequate control of button movement. Therefore, there exists a need for a button assembly that is capable of being linearly displaced in response to a pressing force, but which can also limit tilt and side-to-side wobble movement to achieve a quality feel. In particular there exists a need for such a button assembly capable of supporting a touchpad having a surface much larger than a typical radio or keyboard sized button and which may be up to or greater than the size of a computer mousepad, or about 20 cm×23 cm.

SUMMARY

A button assembly is provided including a touchpad having an upper surface extending in a generally flat plane and being movable between a first position and a second position displaced from the first position in response to the application of a pressing force perpendicular to the upper surface. The button assembly includes a sub-bezel with a housing defining a top side adjacent the touchpad and defining a cavity extending into the housing from the top side. A linear bearing may be disposed in the cavity of the sub-bezel for guiding the touchpad in a linear path perpendicular to the upper surface between the first position and the second position and for limiting displacement of the touchpad outside of the linear path and including a plurality of first ball bearings and a plurality of second ball bearings separated from the first ball bearings by a first distance perpendicular to the upper surface, with the ball bearings sandwiched between a bearing outer member and a bearing inner member.

BRIEF DESCRIPTION OF THE DRAWINGS

The detailed description refers to the following drawings, in which like numerals refer to like items, and in which:

FIG. 10 is a perspective view of an inner-top member of a linear bearing of the example implementation;

FIG. 11 is a perspective view of a bearing outer member of a linear bearing of the example implementation;

DETAILED DESCRIPTION

Figure 1:
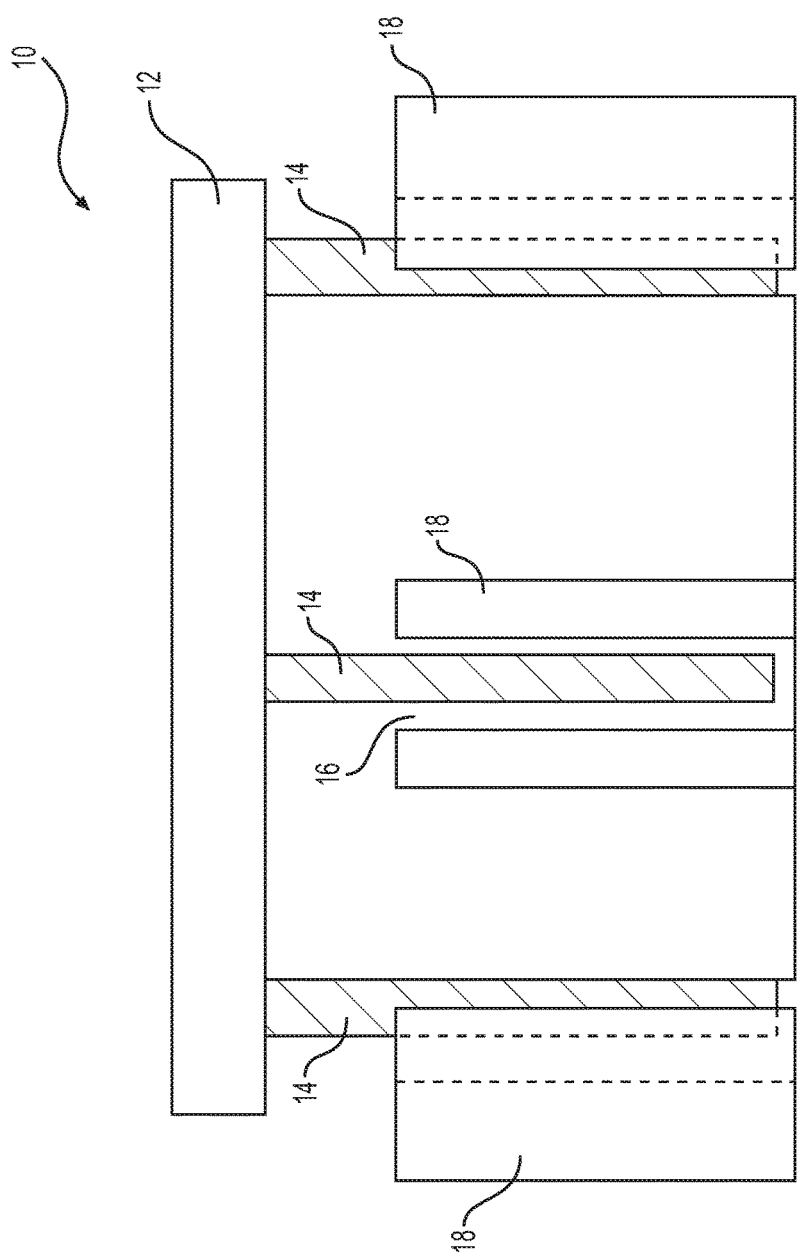
FIG. 1 is a side cut-away view of a button assembly of the prior art.

The invention is described more fully hereinafter with references to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of each" will be interpreted to mean any combination the enumerated elements following the respective language, including combination of multiples of the enumerated elements. For example, "at least one of X, Y, and Z" will be construed to mean X only, Y only, Z only, or any combination of two or more items X, Y, and Z (e.g., XYZ, XZ, YZ, X). Throughout the drawings and the detailed description, unless otherwise described, the same drawing reference numerals are understood to refer to the same elements, features, and structures. The relative size and depiction of these elements may be exaggerated for clarity, illustration, and convenience. Unless otherwise stated, any reference to moving between two or more different positions should be construed as including moving in either direction from one position to another position or vice-versa.

Figure 2:
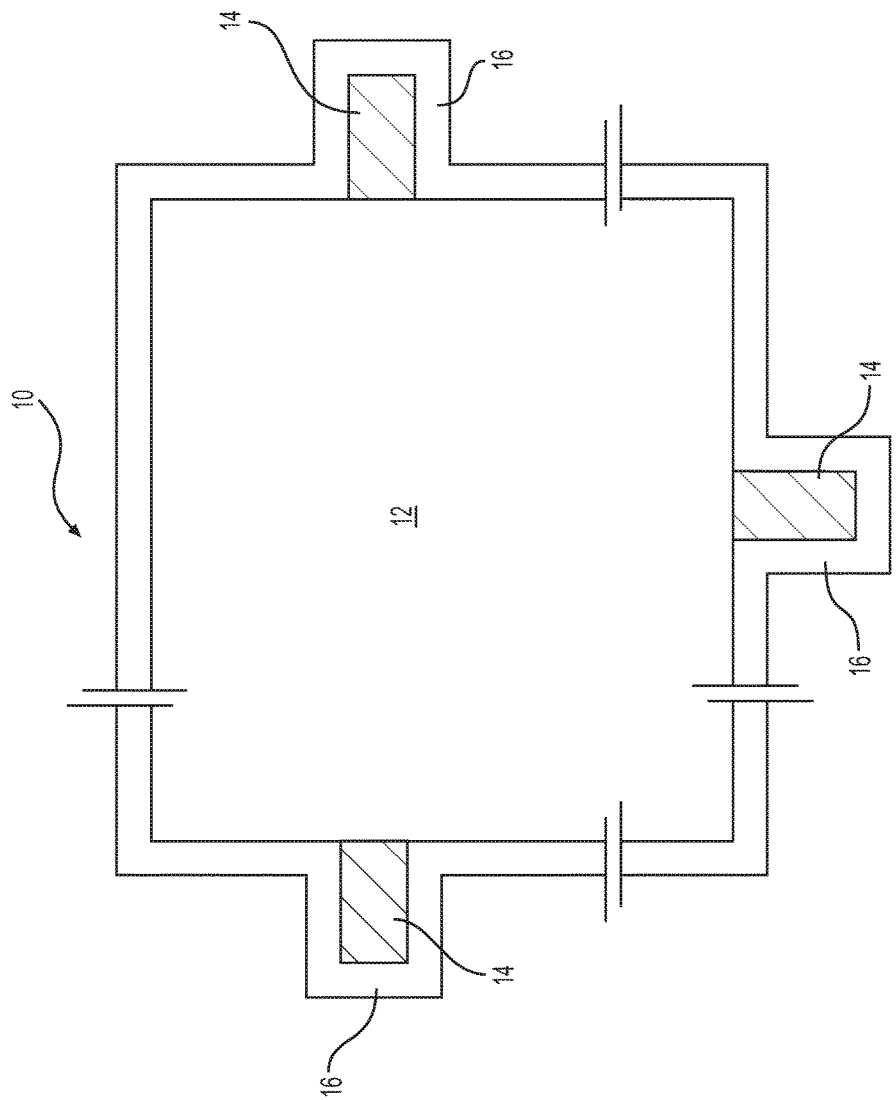
FIG. 2 is a top cut-away view of a button assembly of the prior art.

A button design 10 according to the prior art is shown in FIGS. 1-2, which includes a button pad 12 extending in a generally flat plane with a plurality of guide ribs 14 extending perpendicularly therefrom and disposed within guide slots 16 of a stationary structure 18 located below the button pad 12. As best shown in FIG. 2, small gaps, which may be approximately. mm on each side, are required around each of the guide ribs 14 within the corresponding guide slots 16 to allow the button pad 12 to be displaced linearly while minimizing wobble in each direction except for the desired linear direction perpendicular to the generally flat plane of the button pad 12.

Referring to the Figures, wherein like numerals indicate corresponding parts throughout the several views, a button assembly 20 is disclosed. As best shown in FIGS. 3-8, the button assembly 20 comprises a touchpad 22 including a plate 24 having an upper surface 26 extending in a generally flat plane. The touchpad 22 may be responsive to one or more physical touches, similar to the function of the touchscreen of a smartphone or the trackpad of a laptop computer. The touchpad 22 may alternatively function as a basic pushbutton, being operable only by being physically depressed. As best shown in FIG. 5, the upper surface 26 of the touchpad 22 may have a generally rectangular shape for accepting a 2-dimensional touch-based input. The upper surface 26 of the touchpad 22 may also include a raised peripheral edge 30 to allow a user to feel the edges when using it for touch-based input.

Figure 6:
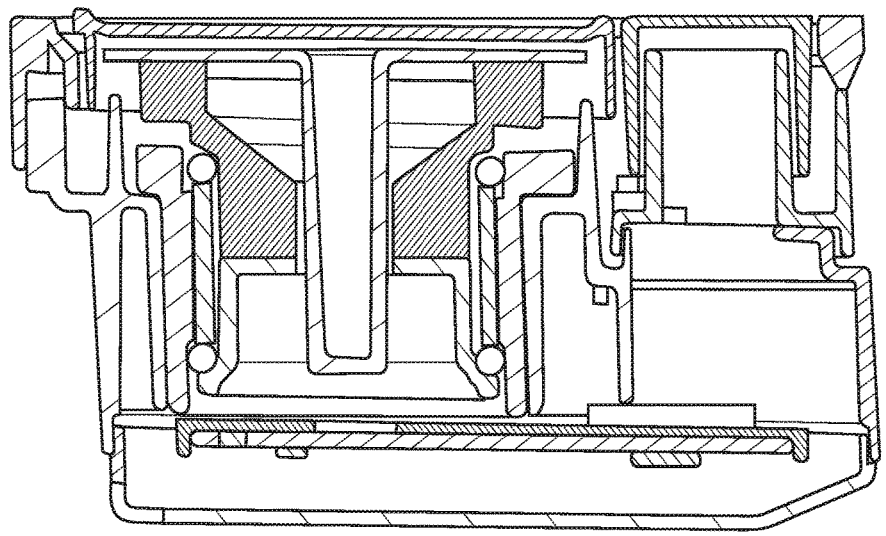
FIG. 6 is a cut-away side view of the example implementation of a button assembly in a first position.
Figure 7:
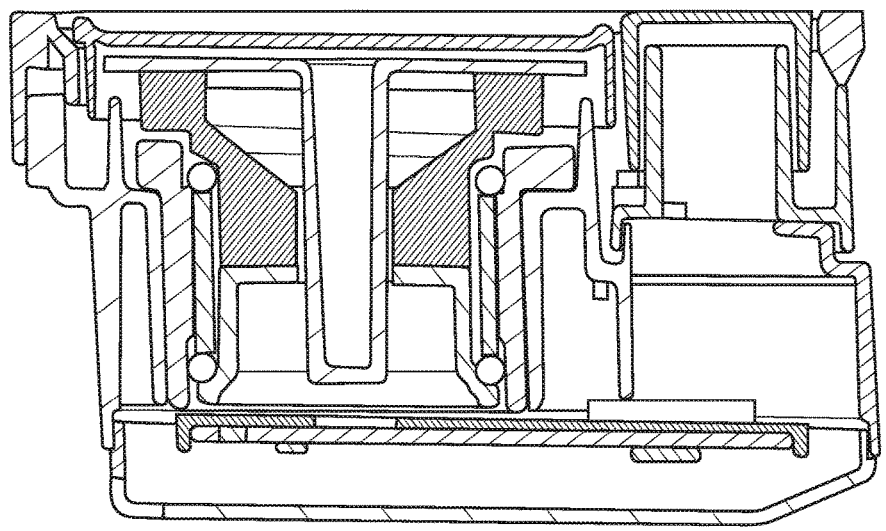
FIG. 7 is a is a cut-away side view of the example implementation of a button assembly in a second position.

As best shown in FIGS. 6-7, the touchpad 22 may be movable between a first position and a second position displaced from the first position in response to the application of a pressing force perpendicular to the upper surface 26. A pressing force above a predetermined actuation force may be required to cause the touchpad 22 to move from the first position. The touchpad 22 may also include an electrically responsive layer 38 opposite the upper surface 26 for converting a touch-based input, such as by a person gliding their finger over the upper surface 26, into an electrical signal. The touchpad 22 may include a base portion 40 defining a bottom surface 42 opposite the upper surface 26. The base portion 40 may also include a rod 44, which may have a generally cylindrical shape, extending generally perpendicularly from a central area of the bottom surface 42 to a closed end 46 for engaging a first switch 48, which may include a dome spring 50, in response to the touchpad 22 being moved to the second position and for biasing the touchpad 22 to the first position. In other words, the button assembly 20 may be responsive to a light or gliding touch on the touchpad 22, and may also be responsive to being more firmly pressed to displace the touchpad 22 from its first position downward into its second position. Such a more firm pressing may correspond, for example, to a selection command or a function similar to a mouse click in a more traditional computer interface.

As best shown in FIG. 5, the button assembly 20 may also include one or more pushbuttons 52 adjacent the touchpad 22, with each being pressable to activate a corresponding electrical switch. In the exemplary embodiment shown in the figures, there may be three pushbuttons 52. Each of the pushbuttons 52 may include a corresponding third indicia, which may be different between each of the pushbuttons 52 to denote the respective function associated therewith.

Figure 8:
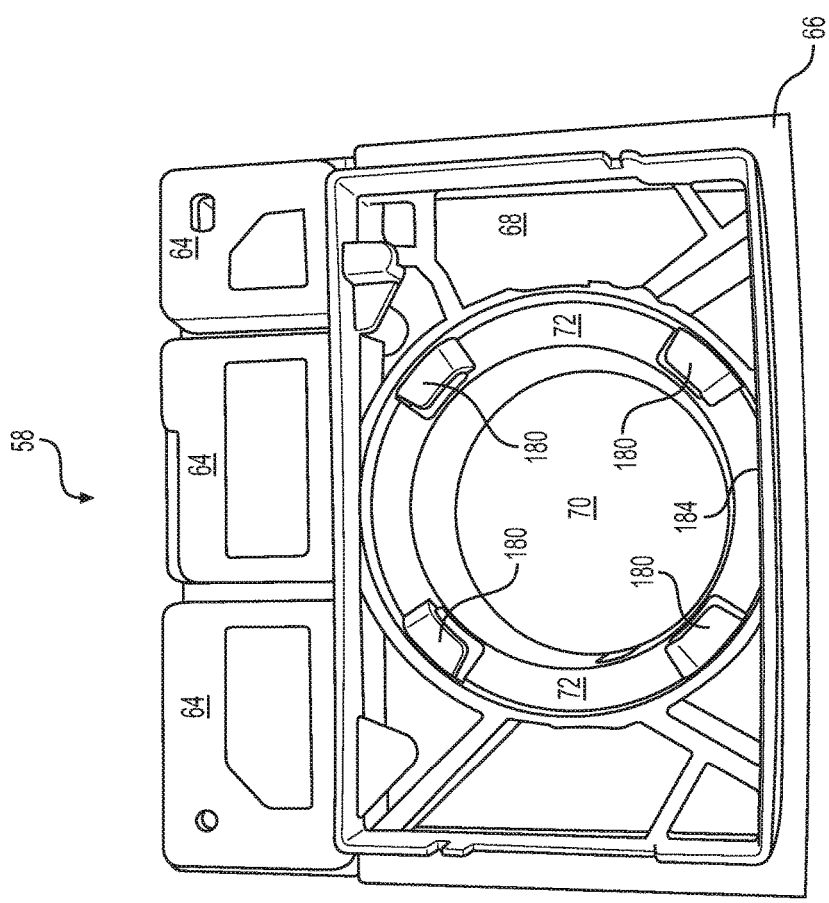
FIG. 8 is a top view of a sub-bezel of the example implementation.

As best shown in FIGS. 3-5, and FIG. 8, the button assembly 20 includes a sub-bezel 58, which may include one or more structures such as mounting tabs for securing the button assembly 20 to a larger assembly such as, for example, to a vehicle body. As shown in FIG. 8, the sub-bezel 58 may include a flat ledge 64 adjacent to a generally rectangular housing 66 defining a top side 68 which, when assembled, is adjacent to the touchpad 22. The sub-bezel 58 may define a cavity 70 having a generally cylindrical shape extending into the housing 66 from the top side 68, and which may also extend to a throat 72 adjacent the top side 68, which may also have a generally cylindrical shape coaxial with and having a larger diameter than that of the cavity 70.

Figure 3:
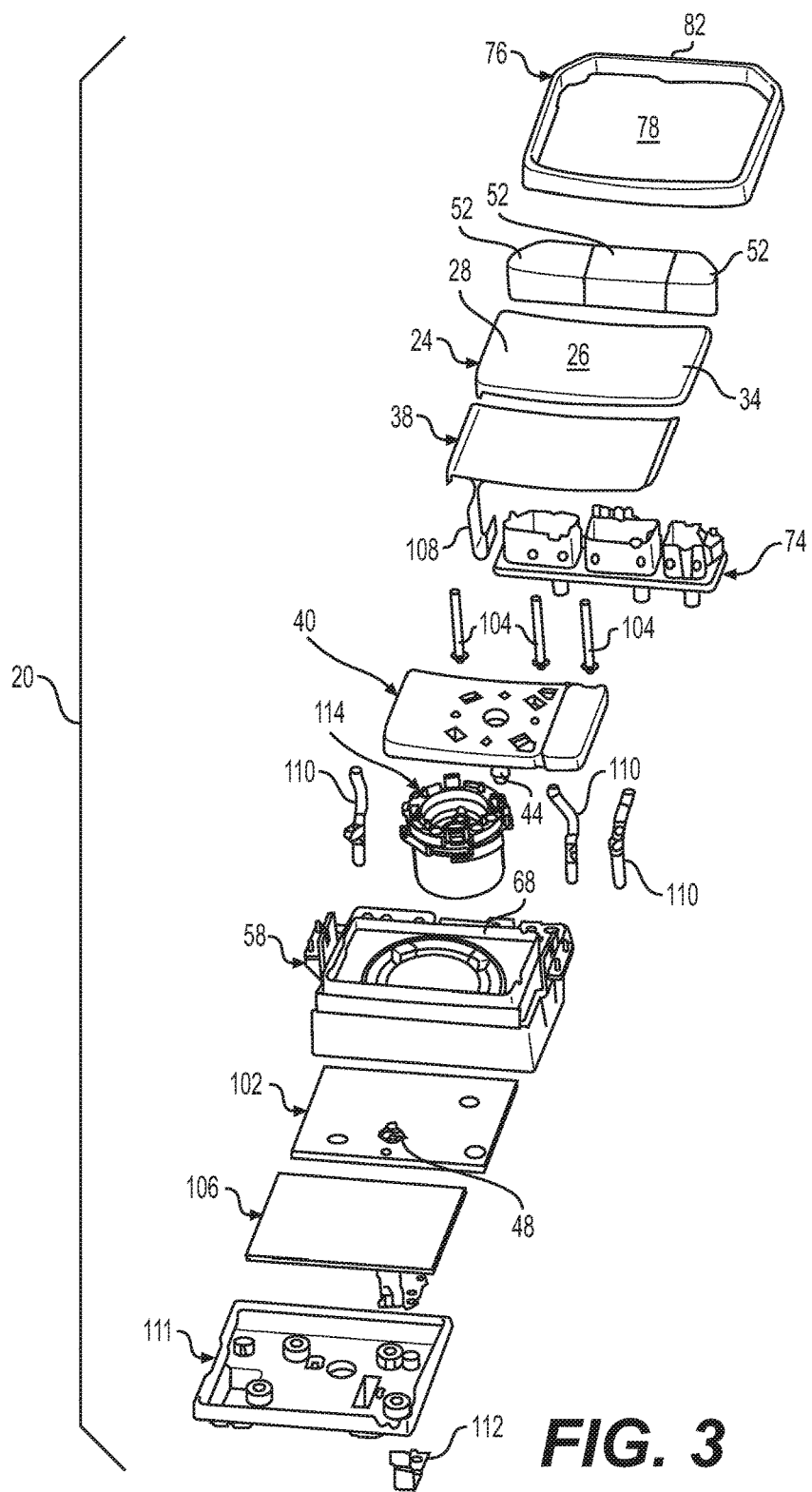
FIG. 3 is an exploded view of an example implementation of a button assembly.
Figure 4:
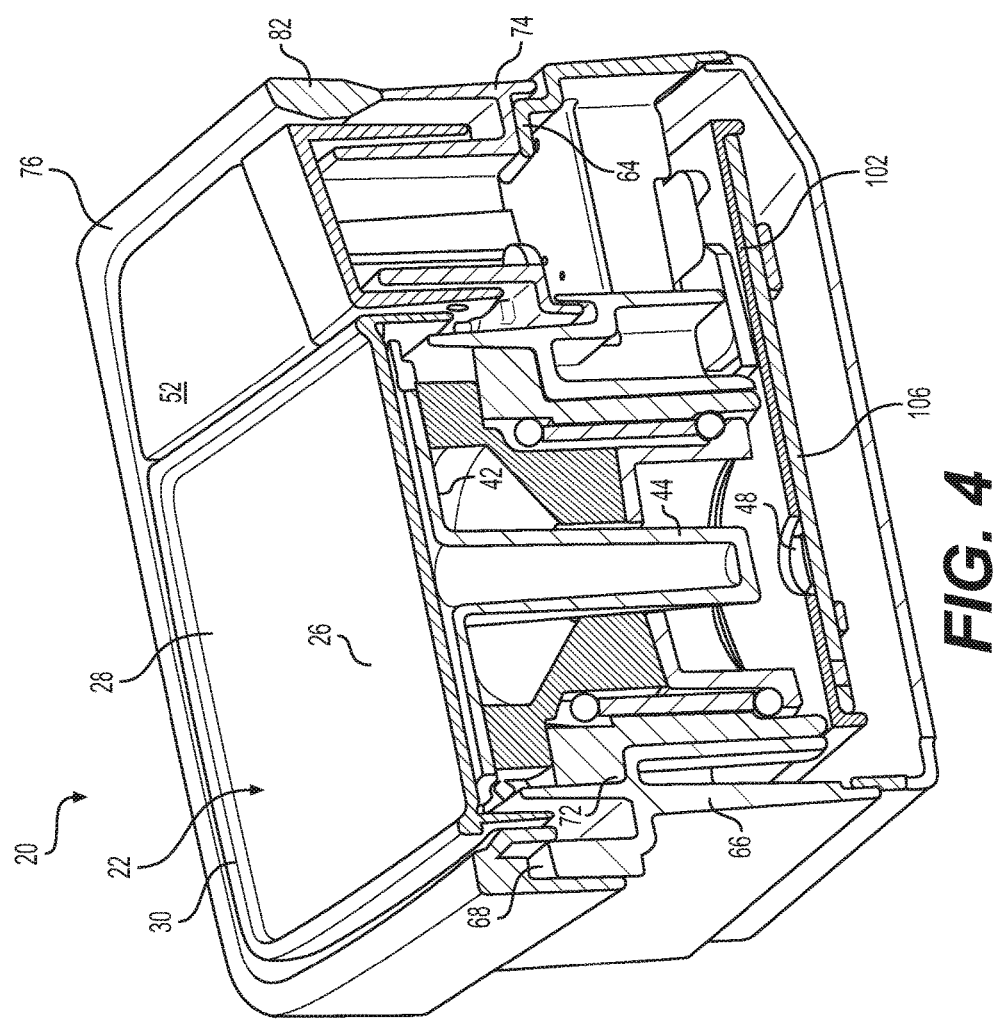
FIG. 4 is a cut-away perspective view of the example implementation of a button assembly.
Figure 5:
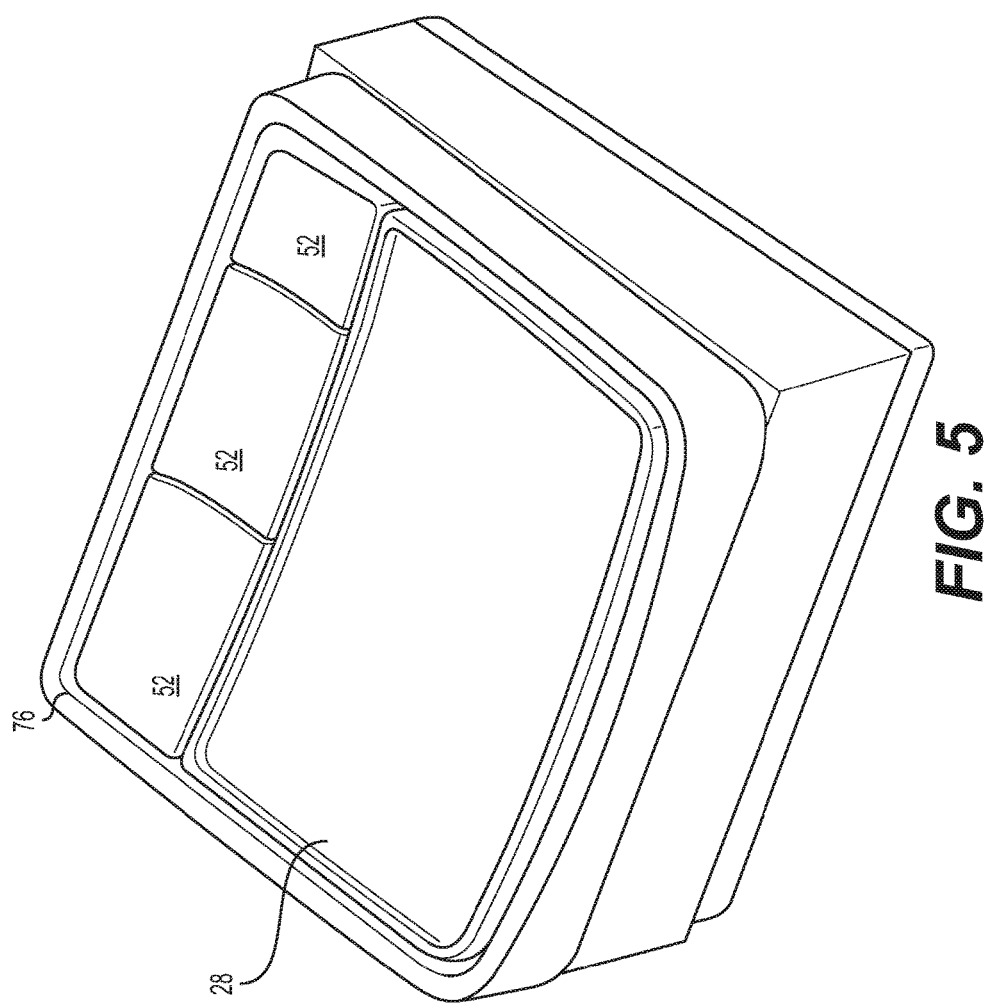
FIG. 5 is a is a perspective view of the example implementation of a button assembly.

As shown in FIGS. 3-4, the button assembly 20 may include a button carrier 74 disposed upon the flat ledge 64 of the sub-bezel 58 for holding and guiding the pushbuttons 52 in a linear path perpendicular to the upper surface 26 of the touchpad 22. The button assembly 20 may also include a top bezel 76 having a generally ring shape and defining a generally rectangular opening 78 for surrounding the touchpad 22. The top bezel 76 may include one or more catches 80 extending outwardly from a first edge 82 and upwardly away from the sub-bezel 58 for securing the button assembly 20 to the vehicle body. The top bezel 76 may also include and a plurality of first flat portions 84 extending outwardly from the first edge 82 and generally parallel to the upper surface 26 of the touchpad 22, which may each define a first locating hole 90 for receiving a corresponding first locating pin 92 of the button carrier 74 for locating and securing the top bezel 76 thereupon. The top bezel 76 may further include a plurality of second flat portions 86 extending outwardly from a second edge 94 opposite the first edge 82 and generally parallel to the upper surface 26 of the touchpad 22, which may each define a second locating hole 96 for receiving a corresponding second locating pin of the sub-bezel 58 for locating and securing the top bezel 76 thereupon.

A switch matt 102 of resilient material may be disposed adjacent the sub-bezel 58 parallel to and opposite from the touchpad 22 which may be elastically deformed in response to the application of force on any of the pushbuttons 52 and for providing an upward biasing force thereto. An actuator post 104 may extend between each of the pushbuttons 52 and a corresponding switch portion of the switch matt 102. The switch matt 102 may also including the dome spring 50 of the first switch 48 for biasing the touchpad 22 upward to its first position. A circuit board 106 may be disposed adjacent and generally parallel to the switch matt 102 opposite the sub-bezel 58. The circuit board 106 may be in electrical communication with the electrically responsive layer 38 with a ribbon cable 108 extending therebetween for receiving the touch-based input applied to the touchpad 22. The circuit board 106 may include a plurality of LED lights, which may shine through corresponding light pipes 110 that extend through the sub-bezel 58, to illuminate each of the pushbuttons 52. The circuit board 106 may also include all or part of the electrical switches corresponding to the pushbuttons 52 and/or an electrical switch activated by the dome spring 50 in response to the touchpad 22 being pressed and displaced to the second position. It should be appreciated that the circuit board 106 may also be responsive to the touchpad 22 being displaced a variable amount between the first and second positions such as, for example, using a linear potentiometer to generate a corresponding variable electrical signal. A lower cover 111 may be disposed adjacent and generally parallel to the circuit board 106 opposite the switch matt 102, and may be secured with a plurality of screws extending therethrough for engaging the sub-bezel 58 and for holding the circuit board 106 and the switch matt 102 with the sub-bezel 58. As shown in FIG. 3, a grounding lug 112 may be attached thereto for providing an electrical grounding connection.

The button assembly 20 may include a linear bearing 114 disposed in the cavity 70 of the sub-bezel 58 for guiding the touchpad 22 in a linear path perpendicular to the upper surface 26 between the first position and the second position and for limiting displacement of the touchpad 22 outside of the linear path. The linear bearing 114 including a plurality of first ball bearings 116 and a plurality of second ball bearings 118 separated from the first ball bearings 116 by a first distance d1 perpendicular to the upper surface 26. As shown in the figures, the button assembly 20 may include four of the first ball bearings 116 and four of the second ball bearings 118, however, the button assembly 20 could include any number of ball bearings 116, 118, and the number of first ball bearings 116 could be the same as or different from the number of second ball bearings 118. The ball bearings 116, 118 may be sandwiched between a bearing outer member 122, which may be formed of Polyoxymethylene (POM), and a bearing inner member 124 which may also be formed of Polyoxymethylene (POM), and which may include an inner-top member 126 secured to an inner-bottom member 128 with one or more fasteners 130, which may be screws. It should be appreciated that other types of fasteners 130 may be used including, for example, one or more rivets, clips, welds, adhesives, etc.

Figure 9:
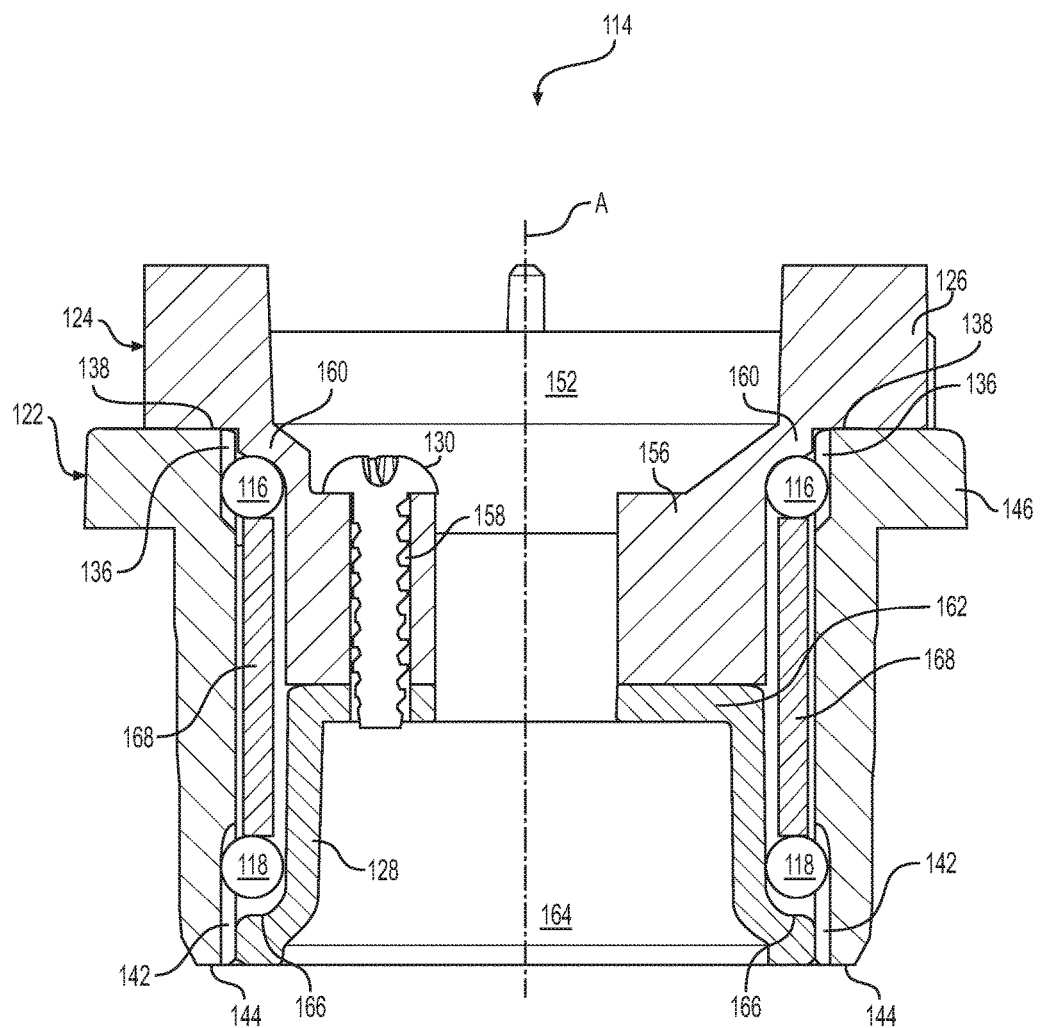
FIG. 9 is a cut-away side view of a linear bearing of the example implementation.

As shown in FIGS. 9 and 11, the bearing outer member 122 may include a tubular side wall 132 extending about an axis A and defining a generally cylindrical inner surface 134 with a plurality of first troughs 136 extending axially from a first end 138 and spaced at regular intervals circumferentially thereabout with each of the first toughs receiving and guiding a corresponding one of the first ball bearings 116 parallel to the axis A. The tubular side wall 132 may also include a plurality of second troughs 142 extending from a second end 144 opposite the first flange 146 and spaced at regular intervals circumferentially thereabout with each of the second troughs 142 receiving and guiding a corresponding one of the second ball bearings 118 parallel to the axis A. A first flange 146 may extend radially outwardly about the first end 138 of the tubular side wall 132 and may define a third locating pin 148 extending axially therefrom for engaging a corresponding indentation in the inner-top member 126 (not shown in the figures).

As best shown in FIGS. 9-10, the inner-top member 126 may be generally cup-shaped, extending between an open upper end 152 and a closed lower end 156, which may define a plurality of one or more first holes 158 extending therethrough for receiving the fastener 130 for securing the inner-top member 126 together with the inner-bottom member 128. The inner-top member 126 may define an upper lip 160 extending radially outwardly for retaining the first ball bearings 116 and may also define a third locating hole (not shown in the figures) for receiving the third locating pin 148 of the bearing outer member 122 for limiting relative rotation therebetween. The inner-bottom member 128 may likewise be generally cup-shaped and extending between a closed upper end 162 for engaging the fastener 130 and an open lower end 164 with a bottom lip 166 extending radially outwardly thereabout for retaining the second ball bearings 118.

Figure 12:
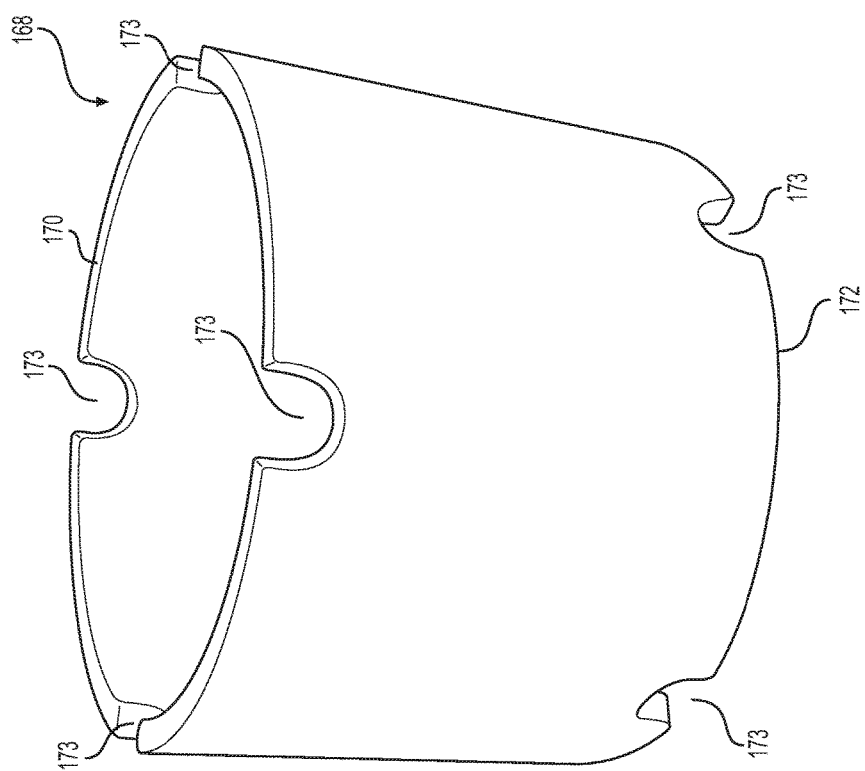
FIG. 12 is a perspective view of a bearing carrier of a linear bearing of the example implementation.

As shown in FIGS. 9 and 12, a bearing carrier 168 may be disposed between the bearing outer member 122 and the bearing inner member 124 for holding the ball bearings 116, 118. The a bearing carrier 168 may a generally tubular shape extending between a top end 170 and a bottom end 172 and may define a plurality of cutouts 173 adjacent each of the ends 170, 172, with each of the cutouts 173 having a U-shape for holding a corresponding one of the ball bearings 116, 118.

As best shown in FIG. 4, and when assembled in the linear bearing 114, each of the inner-top member 126 and the inner-bottom member 128 together may be at least partially disposed within the bearing outer member 122 and may together define a bore 174 therethrough along the axis A, with the rod 44 extending from the touchpad 22 through the bore 174 to engage the first switch 48 for biasing the touchpad 22 to the first position and providing the predetermined actuation force.

According to an aspect, and as shown in FIGS. 3-11, the button assembly 20 may include the first flange 146 of the bearing outer member 122 having a plurality of four first ears 176 each extending circumferentially and radially outwardly to a first peripheral side 178 having a generally constant diameter from the axis A for nesting within the throat 72 of the sub-bezel 58. The throat 72 of the sub-bezel 58 may include a plurality of first L-shaped members 180 extending axially and circumferentially and each configured to hold a corresponding one of the first ears 176 of the bearing outer member 122. As such, the first ears 176 of the bearing outer member 122 and the first L-shaped members 180 within the throat 72 of the sub-bezel 58 may together function as a bayonet-type fitting to secure the linear bearing 114 within the sub-bezel 58 using a twisting motion to engage the first ears 176 within corresponding ones of the first L-shaped members 180. Furthermore, and as shown in FIGS. 8 and 11, the first peripheral side 178 of one or more of the first ears 176 may define a first planar surface 182 for engaging a corresponding second planar surface 184 in the throat 72 of the sub-bezel 58. In this way, the throat 72 may have a larger diameter than the top side 68 of the sub-bezel 58 would otherwise be able to accommodate.

Figure 16:
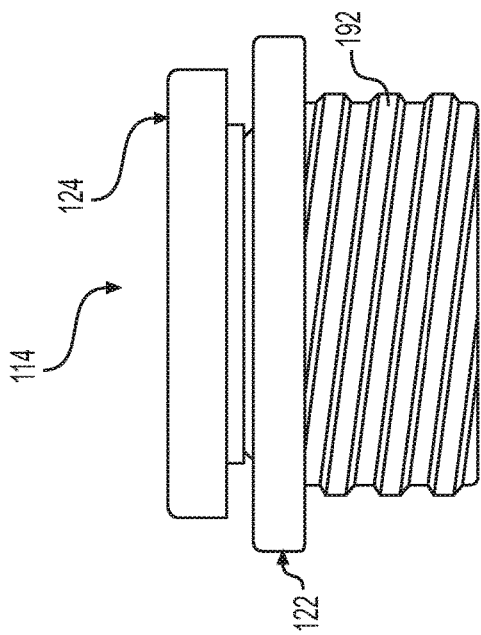
FIG. 16 is a side view of a linear bearing in accordance with the alternative embodiment of FIG. 15.
Figure 15:
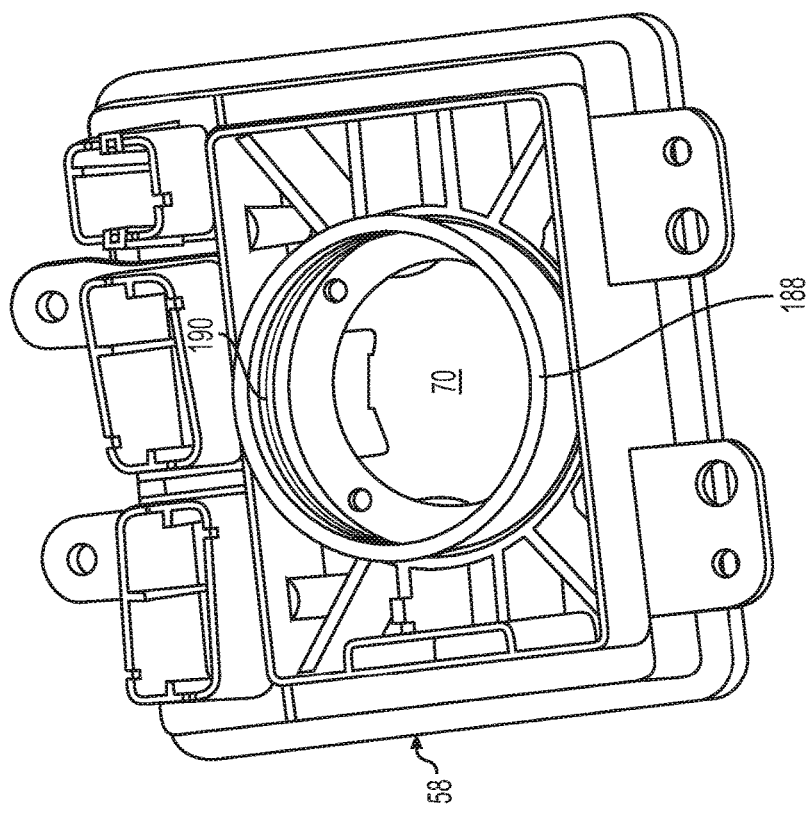
FIG. 15 is a lower perspective view of a sub-bezel of another alternative embodiment in accordance with the present disclosure.

According to an alternative embodiment, and as shown in FIGS. 15-16, the cavity 70 of the sub-bezel 58 may include a generally cylindrical collar 188 defining an internal thread 190 and the bearing outer member 122 may define an external thread 192 thereabout for engaging the internal thread 190 to secure the linear bearing 114 within the cavity 70 of the sub-bezel 58.

According to an aspect, and as best shown in FIGS. 4 and 10, a second flange 194 may extend radially outwardly from the inner-top member 126 of the linear bearing 114 adjacent the open upper end 152 and define a plurality of second ears 186, which may each extend circumferentially and radially outwardly to a second peripheral side 196 having a generally constant diameter from the axis A for nesting within a generally circular recess 198 in the bottom surface 42 of the touchpad 22. A plurality of latching tabs 200 may each extend axially beyond the second flange 194 away from the closed lower end 156 to define a trapezoidal end 212 including a first ledge 214 for engaging a corresponding second ledge on the touchpad 22 (not shown in the FIGS.) and for holding the touchpad 22 onto the linear bearing 114. The second flange 194 may also include one or more fourth locating pins 204 extending axially upwardly for engaging corresponding locating holes (not shown) in the bottom surface 42 of the touchpad 22.

Figure 14:
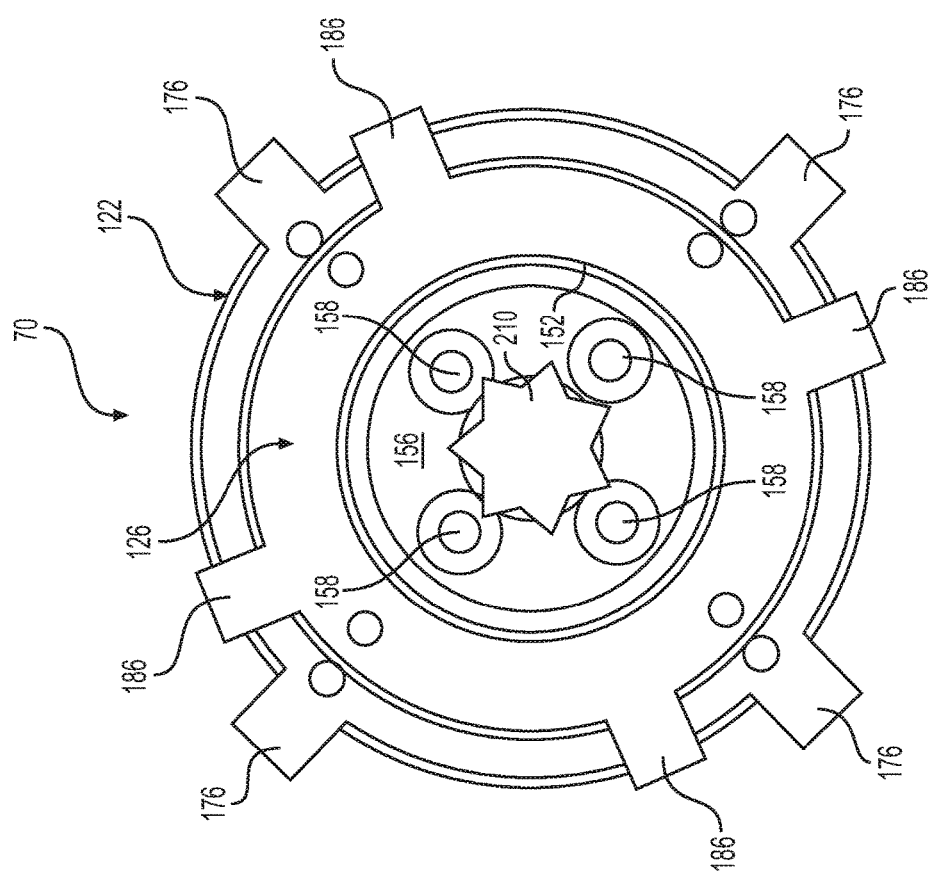
FIG. 14 is a top view of an alternative embodiment of a linear bearing in accordance with the present disclosure.

According to another alternative embodiment, and as shown in FIG. 14, the inner-top member 126 of the linear bearing 114 may include a plurality of second ears 186 each extending circumferentially and radially outwardly adjacent the open upper end 152 for each nesting within a corresponding second L-shaped member (not shown) extending axially and circumferentially in the bottom surface 42 of the touchpad 22. The closed lower end 156 of the inner-top member 126 may define a tooling receptacle 210, which may, for example, have a star shape, for receiving a tool to rotate the bearing inner member 124 to cause the second ears 186 to engage the second L-shaped members with a bayonet-style fitting.

Figure 13:
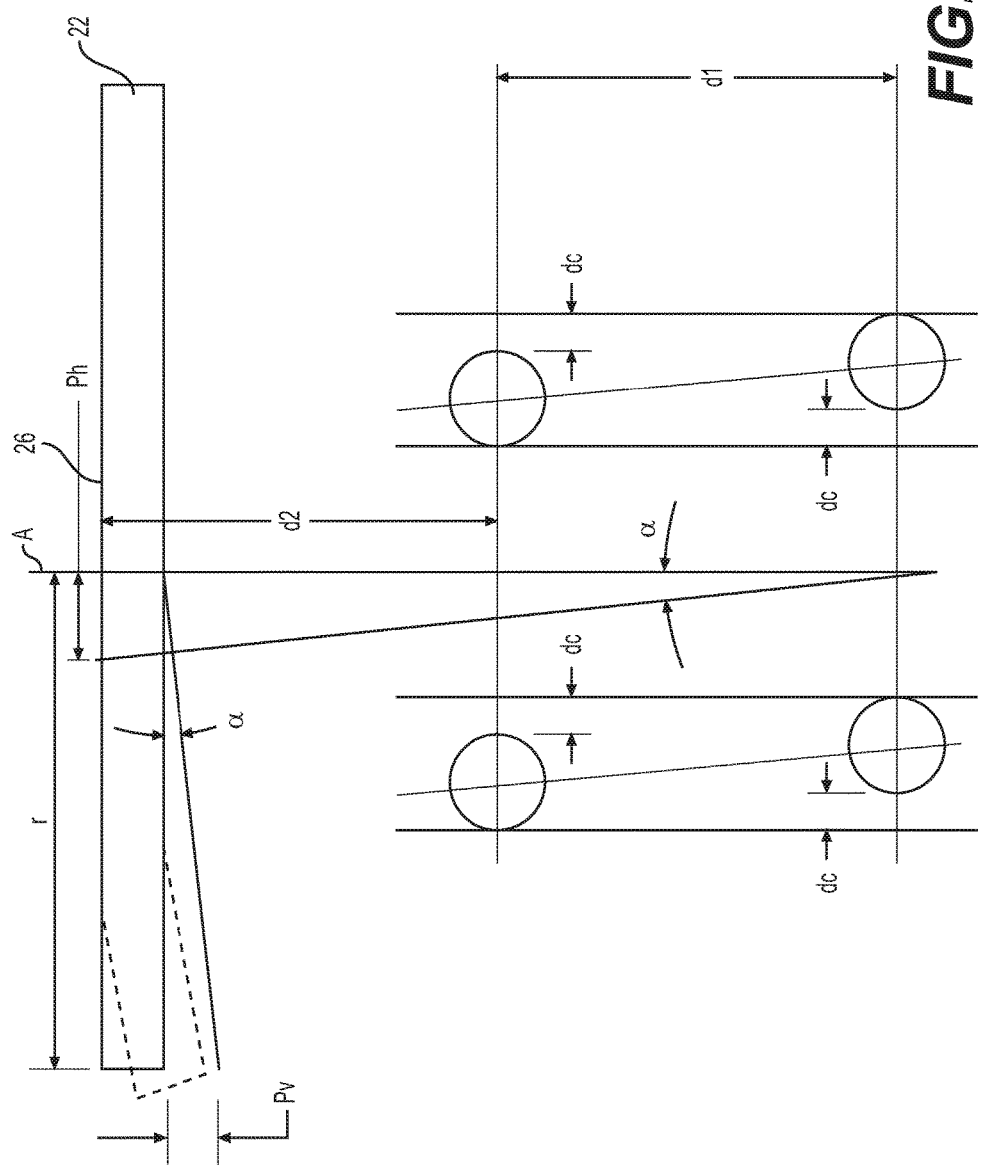
FIG. 13 is a schematic cut-away side view of the button assembly of the example implementation.

According to an aspect, and as shown in FIG. 13, the button assembly 20 of the present disclosure may include a clearance distance dc that the ball bearings 116, 118 are free to move perpendicular to the axis A. The button assembly 20 may be provided with a first distance d1 of 11.25 mm and a second distance d2 between the first ball bearings 116 and the upper surface 26 of the touchpad 22 of about 8.5 mm, and may allow a touchpad 22 to tilt a maximum tilt angle α of 0.713°, allowing for a touchpad 22 to have a vertical play Pv of 0.49 mm parallel to the axis A at the center of a side edge a radial distance r of 40 mm away from the axis A. It also allows for the touchpad 22 to have a horizontal play Ph of 0.25 mm perpendicular to the axis. At a corner of the touchpad 22 a radial distance r of 48 mm away from the axis A, the vertical play Pv of 0.59 mm parallel to the axis A. Increasing the first distance d1 to 18.75 mm, while keeping the other dimensions constant, reduces the maximum tilt angle α to 0.428°, allowing the same touchpad 22 to have a vertical play Pv of 0.299 mm at the center of a side edge a radial distance r of 40 mm away from the axis A and a horizontal play Ph of 0.20 mm. The vertical play Pv and horizontal play Ph dimensions may also be known as "vertical wobble" and "horizontal wobble" respectively.

Obviously, many modifications and variations of the present invention are possible in light of the above teachings and may be practiced otherwise than as specifically described while within the scope of the appended claims.

What is claimed is:

1. A button assembly comprising:
a touchpad having an upper surface and being movable between a first position and a second position displaced from said first position in response to the application of a pressing force perpendicular to said upper surface, wherein the touchpad includes a base portion defining a bottom surface opposite said upper surface and a rod extending generally perpendicularly from said bottom surface for engaging a first switch and for biasing said touchpad into said first position;
a sub-bezel including a housing defining a top side adjacent said touchpad and defining a cavity extending into said housing from said top side; and
a linear bearing disposed in said cavity of said sub-bezel for guiding said touchpad in a linear path perpendicular to said upper surface between said first position and said second position and for limiting displacement of said touchpad outside of said linear path and including a plurality of first ball bearings and a plurality of second ball bearings separated from said first ball bearings by a first distance perpendicular to said upper surface with said ball bearings sandwiched between a bearing outer member and a bearing inner member,
wherein said bearing inner member defines a bore therethrough with said rod extending from said touchpad through said bore to engage said first switch.

2. The button assembly according to claim 1 wherein at least one of said bearing outer member or said bearing inner member defines a plurality of first troughs extending perpendicular to said upper surface and with each of said first troughs holding and guiding a corresponding one of said first ball bearings to guide said touchpad in said linear path.

3. The button assembly according to claim 2 wherein at least one of said bearing outer member or said bearing inner member defines a plurality of second troughs extending perpendicular to said upper surface and with each of said second troughs holding and guiding a corresponding one of said second ball bearings to guide said touchpad in said linear path.

4. The button assembly according to claim 1 wherein said bearing outer member includes a tubular side wall extending about an axis.

5. The button assembly of claim 1 wherein said bearing outer member includes a first flange with a plurality of first ears each extending outwardly to a first peripheral side, and wherein said sub-bezel includes a plurality of first L-shaped members extending axially and circumferentially and each configured to hold a corresponding one of said first ears of said bearing outer member; and
wherein said first ears of said bearing outer member and said first L-shaped members of said sub-bezel together function as a bayonet-type fitting to secure said linear bearing within said sub-bezel with relative rotation therebetween to engage said first ears within corresponding ones of said first L-shaped members.

6. The button assembly according to claim 1 wherein said bearing inner member an inner-top member being generally cup-shaped and extending between an open upper end and a closed lower end; and
wherein said bearing inner member includes an inner-bottom member being generally cup-shaped and extending between an open lower end and a closed upper end secured to said closed lower end of said inner-top member.

7. The button assembly according to claim 6 wherein said inner-top member includes an upper lip extending radially outwardly about said open upper end for retaining said first ball bearings within said linear bearing.

8. The button assembly according to claim 6 wherein said open lower end of said inner-bottom member includes a bottom lip extending radially outwardly thereabout for retaining said second ball bearings within said linear bearing.

9. The button assembly of claim 6 wherein said inner-top member of said linear bearing defines a plurality of latching tabs extending away from said closed lower end to define a trapezoidal end including a first ledge for engaging a corresponding second ledge on said touchpad and for holding said touchpad onto said linear bearing.

10. The button assembly of claim 6 wherein said inner-top member of said linear bearing further includes a plurality of second ears each extending and radially outwardly adjacent said open upper end for each nesting within a corresponding second L-shaped member in said bottom surface of said touchpad; and
said closed lower end of said inner-top member defining a tooling receptacle for receiving a tool to rotate said bearing inner member and to cause said second ears to engage said second L-shaped members with a bayonet-style fitting.

11. The button assembly according to claim 1 wherein at least one of said bearing outer member or said bearing inner member comprises Polyoxymethylene (POM).

12. The button assembly according to claim 1 further including a bearing carrier disposed between said bearing outer member and said bearing inner member for holding said ball bearings, the bearing carrier including a top end and a bottom end, wherein the bearing carrier defines a plurality of cutouts disposed adjacent each of the top end and the bottom end of the bearing carrier, wherein each of said cutouts having a U-shape for holding a corresponding one of said ball bearings.

13. The button assembly of claim 1 wherein said within said cavity of said sub-bezel includes a generally cylindrical collar defining an internal thread and said bearing outer member defines an external thread thereabout for engaging said internal thread to secure said linear bearing within said cavity of said sub-bezel.

14. A button assembly comprising:
a touchpad having an upper surface and being movable between a first position and a second position displaced from said first position in response to the application of a pressing force perpendicular to said upper surface;
a linear bearing for guiding said touchpad in a linear path perpendicular to said upper surface between said first position and said second position and for limiting displacement of said touchpad outside of said linear path and including a plurality of first ball bearings and a plurality of second ball bearings separated from said first ball bearings by a first distance perpendicular to said upper surface with said ball bearings sandwiched between a bearing outer member and a bearing inner member;

said bearing inner member including an inner-top member secured to an inner-bottom member;

said bearing inner member including an inner-top member being generally cup-shaped and extending between a closed lower end and an open upper end;

said inner-bottom member being generally cup-shaped and extending between an open lower end and a closed upper end secured to said closed lower end of said inner-top member.

15. The button assembly of claim 14 wherein said inner-top member defines an upper lip extending radially outwardly about said open upper end for retaining said first ball bearings within said linear bearing.

16. The button assembly of claim 14 wherein said within inner-bottom member defines a bottom lip extending radially outwardly about said open lower end for retaining said second ball bearings within said linear bearing.

17. A button assembly comprising:

a touchpad having an upper surface and being movable between a first position and a second position displaced from said first position in response to the application of a pressing force perpendicular to said upper surface; and a linear bearing for guiding said touchpad in a linear path perpendicular to said upper surface between said first position and said second position and for limiting displacement of said touchpad outside of said linear path, wherein the linear bearing includes:

a bearing outer member, said bearing outer member having a tubular side wall extending about an axis defining a generally cylindrical inner surface, a bearing inner member at least partially disposed in the generally cylindrical inner surface of the bearing outer member, wherein the bearing inner member includes a generally cup-shaped inner-top member having an open upper end and a closed lower end, and a generally cup-shaped inner-bottom member having a closed upper end and an open lower end, wherein the closed lower end of the inner-top member is secured to a closed upper end of the inner-bottom member, a plurality of first ball bearings and a plurality of second ball bearings separated from said first ball bearings by a first distance perpendicular to said upper surface of the touchpad, wherein said plurality of first ball bearings and said plurality of second ball bearings are sandwiched between the bearing outer member and the bearing inner member, and a bearing carrier disposed between said bearing outer member and said bearing inner member for holding said plurality of first ball bearings and said plurality of second ball bearings, the bearing carrier including a top end and a bottom end, wherein the bearing carrier defines a plurality of cutouts disposed adjacent each of the top end and the bottom end of the bearing carrier, wherein each of said cutouts having a U-shape for holding a corresponding one of said plurality of first ball bearings and said plurality of second ball bearings.

18. The button assembly of claim 17 wherein said bearing inner member further comprises:

an upper lip defined in the inner-top member extending radially outwardly about said open upper end for retaining said first plurality of ball bearings within said bearing carrier in the linear bearing; and a bottom lip defined in the inner-bottom member extending radially outwardly about said open lower end for retaining said second plurality of ball bearings within said bearing carrier in the linear bearing.

19. The button assembly of claim 17 wherein at least one of said bearing outer member and said bearing inner member defines a plurality of first troughs extending perpendicular to said upper surface and with each of said first troughs holding and guiding a corresponding one of said first plurality of ball bearings to guide said touchpad in said linear path.

20. The button assembly of claim 17 wherein at least one of said bearing outer member or said bearing inner member defines a plurality of second troughs extending perpendicular to said upper surface and with each of said second troughs holding and guiding a corresponding one of said second plurality of ball bearings to guide said touchpad in said linear path.

* * * * *